United States Patent
Mitsuda et al.

(10) Patent No.: US 9,598,762 B2
(45) Date of Patent: Mar. 21, 2017

(54) DIAMOND-LIKE CARBON FILM-FORMED MATERIAL AND METHOD FOR PRODUCING THE SAME

(75) Inventors: Yoshitaka Mitsuda, Kawaguchi (JP); Kenji Nose, Toda (JP); Yuya Morihisa, Meguro-ku (JP)

(73) Assignees: Yoshitaka Mitsuda, Tokyo (JP); SMC KABUSHIKI KAISHA, Tokyo (JP)

( * ) Notice: Subject to any disclaimer, the term of this patent is extended or adjusted under 35 U.S.C. 154(b) by 581 days.

(21) Appl. No.: 12/892,132

(22) Filed: Sep. 28, 2010

(65) Prior Publication Data
US 2011/0094628 A1  Apr. 28, 2011

(30) Foreign Application Priority Data
Oct. 22, 2009 (JP) ................................ 2009-243565

(51) Int. Cl.
- C23C 8/36  (2006.01)
- C23C 14/02 (2006.01)
- C23C 14/06 (2006.01)
- C23C 14/34 (2006.01)

(52) U.S. Cl.
CPC ........ C23C 14/027 (2013.01); C23C 14/0605 (2013.01); C23C 14/345 (2013.01)

(58) Field of Classification Search
CPC ...................................................... C23C 8/36
See application file for complete search history.

(56) References Cited

U.S. PATENT DOCUMENTS

| | | | | |
|---|---|---|---|---|
| 5,411,797 | A * | 5/1995 | Davanloo et al. | 428/336 |
| 5,987,942 | A | 11/1999 | Ichinose | |
| 6,071,103 | A | 6/2000 | Hirano et al. | |
| 6,299,425 | B1 | 10/2001 | Hirano et al. | |
| 6,994,474 | B2 * | 2/2006 | Kinno et al. | 384/492 |
| 2007/0082129 | A1 | 4/2007 | Shimoda et al. | |
| 2007/0141347 | A1 | 6/2007 | Nakagawa et al. | |
| 2008/0063894 | A1 | 3/2008 | Nakashima et al. | |

FOREIGN PATENT DOCUMENTS

| | | |
|---|---|---|
| JP | 03-219079 | 9/1991 |
| JP | 04-074797 | 3/1992 |
| JP | 5-186870 | 7/1993 |
| JP | 10-82390 | 3/1998 |

(Continued)

OTHER PUBLICATIONS

Walter, K. C., M. Nastasi, and C. Munson. "Adherent diamond-like carbon coatings on metals via plasma source ion implantation." Surface and Coatings Technology 93.2 (1997): 287-291.*

(Continued)

*Primary Examiner* — Jessee Roe
(74) *Attorney, Agent, or Firm* — Oblon, McClelland, Maier & Neustadt, L.L.P.

(57) ABSTRACT

In a DLC film-formed material, an intermediate layer is disposed between a substrate and a DLC film. The intermediate layer is a composite layer containing a component metal atom derived from the substrate and a diamond-like carbon. For example, such intermediate layer can be formed by applying a negative bias to the substrate while reducing the absolute value of the negative bias with time, in a plasma layer formation process. A carbon target or a hydrocarbon gas can be used as a carbon source.

20 Claims, 9 Drawing Sheets

(56) References Cited

FOREIGN PATENT DOCUMENTS

| JP | 10-203896 | 8/1998 |
|---|---|---|
| JP | 10-203897 | 8/1998 |
| JP | 2007-100189 | 4/2007 |
| JP | 2007-162099 | 6/2007 |
| JP | 2008-24996 | 2/2008 |
| JP | 2008-69372 | 3/2008 |
| KR | 10-0374975 | 7/2003 |

OTHER PUBLICATIONS

Hou, Q. R., and J. Gao. "Enhanced adhesion of diamond-like carbon films with a composition-graded intermediate layer." Applied Physics A: Materials Science & Processing 68.3 (1999): 343-347.*

Office Action mailed Aug. 6, 2013, in Japanese Patent Application No. 2009-243565, filed Oct. 22, 2009 (with English translation of pertinent portion).

Office Action issued Apr. 27, 2016 in Korean Patent Application No. 10-2010-0101779 (with English translation).

* cited by examiner

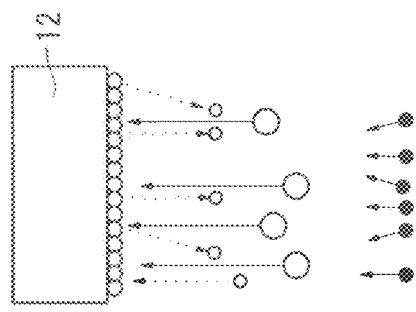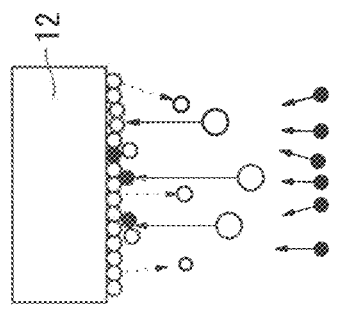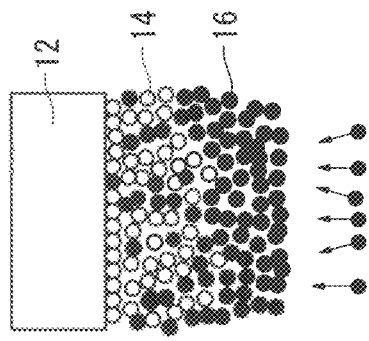

_US 9,598,762 B2_

DIAMOND-LIKE CARBON FILM-FORMED MATERIAL AND METHOD FOR PRODUCING THE SAME

CROSS-REFERENCE TO RELATED APPLICATION

This application is based upon and claims the benefit of priority from Japanese Patent Application No. 2009-243565 filed on Oct. 22, 2009, of which the contents are incorporated herein by reference.

BACKGROUND OF THE INVENTION

Field of the Invention

The present invention relates to a diamond-like carbon film-formed material, which contains a substrate and a diamond-like carbon film formed on a surface thereof with an intermediate layer therebetween, and a method for producing the same.

Description of the Related Art

As is well known, a diamond-like carbon (hereinafter referred to also as DLC) film is composed of an amorphous carbon, has high hardness and low friction coefficient, and thereby has been used as an abrasion-resistant lubricant film on various substrates. Specifically, the DLC film has been used as a surface coating of a magnetic disk reading head, a working tool, etc. Known methods for forming the DLC film include plasma chemical vapor synthesis (CVD) methods, sputtering methods, arc ion plating methods, etc.

The bonding strength between the DLC film and the substrate is not very high, and the DLC film tends to be readily peeled off from the substrate. Therefore, various studies have been made on the prevention of the peeling of the DLC film.

For example, proposed in Japanese Laid-Open Patent Publication No. 10-203897 is a method for cleaning a surface of a substrate, which contains the steps of irradiating the substrate with hydrogen ions to induce a reduction reaction of the surface, and then exposing the surface to a sputtering gas. However, when the substrate is composed of a substance that cannot be readily converted to a carbide (such as aluminum, magnesium, silicon, or an alloy thereof), it is difficult to prevent the peeling of the DLC film even in the case of using thus cleaned surface.

Japanese Laid-Open Patent Publication No. 10-203897 describes, in the paragraph 0023, a method, which contains the steps of implanting carbon ions into a substrate to form a carbon-containing layer as an ion-implanted layer, and thereafter forming a DLC film thereon. However, in this method, the carbon-containing layer is formed inside the substrate, and probably the surface composition of the substrate is hardly changed by the ion implantation. Therefore, it is difficult to maintain a satisfactory bonding strength between the DLC film and the surface, and thus to prevent the peeling of the DLC film.

Another proposed method for preventing the peeling of the DLC film contains disposing an intermediate layer between the substrate and the DLC film. For example, Japanese Laid-Open Patent Publication No. 10-203896 describes a method containing the steps of forming an adhesion layer composed of silicon, tungsten, titanium, or aluminum and a DLC pretreatment layer composed of silicon carbide, tungsten carbide, titanium carbide, or aluminum carbide in this order on a surface of the substrate, and forming the DLC film on the DLC pretreatment layer.

In addition, Japanese Laid-Open Patent Publication No. 2008-024996 describes a method containing the steps of forming a metal-containing DLC layer as the intermediate layer on a substrate composed of an alloy of aluminum, magnesium, or titanium, and then stacking the DLC film and the metal-containing DLC layer alternately. The metal in the metal-containing DLC layer is tungsten, molybdenum, chromium, or titanium, and the content of the metal is 5% to 15% by weight.

When the intermediate layer is formed as described above, a target and equipment for generating a metal for the intermediate layer are required as shown in FIG. 2 of Japanese Laid-Open Patent Publication No. 10-203896 and the paragraph 0031 of Japanese Laid-Open Patent Publication No. 2008-024996. Thus, the film formation apparatus has a complicated large structure, resulting in high equipment costs disadvantageously.

SUMMARY OF THE INVENTION

A general object of the present invention is to provide a diamond-like carbon film-formed material having a DLC film, which is not readily peeled off from a substrate.

A principal object of the present invention is to provide a method for producing a diamond-like carbon film-formed material, which can be carried out using a common film formation apparatus.

According to an aspect of the present invention, there is provided a diamond-like carbon film-formed material comprising a substrate and a diamond-like carbon film formed on a surface thereof with an intermediate layer therebetween, wherein the intermediate layer is a composite layer containing a component metal atom derived from the substrate and a diamond-like carbon. The component metal atom derived from the substrate means a metal atom obtained from the substrate as the generation source, and does not include a metal atom obtained by using a target or the like other than the substrate as the generation source.

The intermediate layer containing such components is firmly bonded to both of the substrate and the DLC film. Since the intermediate layer contains the component metal atom from the substrate, the intermediate layer is highly compatible with the substrate. Also, since the intermediate layer contains the DLC, the intermediate layer is highly compatible with the DLC film.

Therefore, the intermediate layer is connected to each of the substrate and the DLC film with a satisfactory bonding strength. As a result, the DLC film is firmly bonded to the substrate by the intermediate layer formed therebetween, and the DLC film is prevented from peeling off.

Preferred examples of components of the substrate include aluminum, magnesium, silicon, and alloys containing at least one of aluminum, magnesium, and silicon. It is known that the DLC film is relatively readily peeled from such metals. In the present invention, it is possible to form the DLC film that does not readily peel off even from these metals.

The above metals are lightweight, so that the resultant DLC film-formed material can achieve low weight.

A composition ratio of the component metal atom in the intermediate layer may be decreased in a direction from the substrate to the diamond-like carbon film. In this case, the intermediate layer may be obtained as a gradient layer, which has a property varying depending on the change of the metal and DLC composition ratios. Thus, even in a case where the substrate and the DLC film have a thermal expansion coefficient difference, the substrate-side portion of the intermediate layer has a thermal expansion coefficient approximately equal to that of the substrate, and the DLC film-side portion of the intermediate layer has a thermal expansion coefficient approximately equal to that of the DLC film. As a result, for example when the DLC film-formed material is used in a high-temperature environment, the DLC film can be prevented from peeling off due to the thermal expansion coefficient mismatch between the substrate and the DLC film.

According to another aspect of the present invention, there is provided a method for producing a diamond-like carbon film-formed material comprising a substrate and a diamond-like carbon film formed on a surface thereof with an intermediate layer therebetween, the method comprising the steps of: applying a negative bias to the substrate in a plasma to release a component metal atom from the substrate into the plasma, generating a carbon atom from a carbon source while continuing the application of the negative bias to the substrate, reducing an absolute value of voltage of the negative bias, thereby depositing the component metal atom from the substrate and the carbon atom on the surface of the substrate, in order to form the intermediate layer as a composite layer containing the component metal atom from the substrate and a diamond-like carbon, and reducing the absolute value of the voltage of the negative bias to zero, thereby depositing only the carbon atom on the intermediate layer, to form the diamond-like carbon film.

The intermediate layer containing the component metal atom derived from the substrate (the metal atom obtained from the substrate as the generation source) and the DLC film can be easily formed by the above steps.

Since the metal atom for the intermediate layer is obtained from the substrate as the generation source, a further target and equipment are not required to form the intermediate layer. Thus, the structure of the film formation apparatus can be simple without enlarging the apparatus, resulting in low equipment costs.

The negative bias applied initially to release the component metal atom from the substrate into the plasma (the initial bias) may have a voltage of −100 to −1000 V.

It is preferred that the absolute value of the voltage of the negative bias is reduced stepwise or gradually from that of the initial bias applied for releasing the component metal atom from the substrate into the plasma, to zero for forming the diamond-like carbon film. In this case, the intermediate layer can be easily formed such that the composition ratio of the metal is decreased and the composition ratio of the DLC is increased in the direction from the substrate to the DLC film.

In the present invention, the intermediate layer containing the metal atom generated from the substrate and the DLC is formed on the surface of the substrate, and the DLC film is formed thereon. The intermediate layer is highly compatible with both the substrate and the DLC film, and thereby is firmly bonded thereto. Therefore, the intermediate layer is connected to each of the substrate and the DLC film with a satisfactory bonding strength. As a result, the DLC film can be firmly bonded to the substrate by the intermediate layer therebetween, and the DLC film can be prevented from peeling off.

The above and other objects, features and advantages of the present invention will become more apparent from the following description when taken in conjunction with the accompanying drawings in which a preferred embodiment of the present invention is shown by way of illustrative example.

BRIEF DESCRIPTION OF THE DRAWINGS

FIGS. 3A to 3C are each enlarged schematic views showing a principal part of formation of an intermediate layer and a DLC film;

DESCRIPTION OF THE PREFERRED EMBODIMENTS

A preferred embodiment of the DLC film-formed material and the production method of the present invention will be described in detail below with reference to the accompanying drawings.

Figure 1:
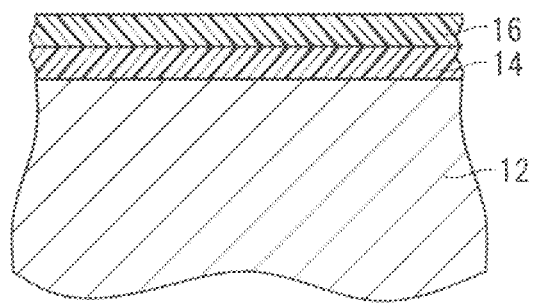
FIG. 1 is an enlarged longitudinal cross-sectional view showing a principal part of a DLC film-formed material according to an embodiment of the present invention.

FIG. 1 is an enlarged longitudinal cross-sectional view showing a principal part of a DLC film-formed material 10 according to this embodiment. The DLC film-formed material 10 is obtained by forming an intermediate layer 14 and a DLC film 16 in this order on a surface of a substrate 12.

The substrate 12 is a metal member. In this embodiment, the substrate 12 preferably contains aluminum, magnesium, silicon, or an alloy containing at least one of the elements. In general, such metals, particularly silicon, cannot be readily converted to a carbide, and it is difficult to prevent the peeling of the DLC film 16 from the metal. Despite this, in this embodiment, the substrate 12 may be composed of the metal.

The DLC film-formed material 10 can be preferably used in a magnetic disk reading head, a working tool, etc., though not particularly restrictive.

The intermediate layer 14 is a composite layer containing a DLC and a component metal atom derived from the substrate 12 (in this embodiment, aluminum, magnesium, silicon, etc.) The intermediate layer 14 contains the component metal atom from the substrate 12, and thereby is firmly bonded to the substrate 12.

In the intermediate layer 14, a portion closer to the substrate 12 has a higher metal composition ratio and a lower DLC composition ratio. On the contrary, a portion more distant from the substrate 12 has a lower metal composition ratio and a higher DLC composition ratio. Thus, the intermediate layer 14 is a gradient layer having metal and DLC composition ratios varying in the thickness direction.

The satisfactory thickness of the intermediate layer 14 is about 0.01 to 1.0 μm, though not particularly restrictive.

The DLC film 16 formed on the intermediate layer 14 is composed of only the DLC. Thus, the DLC film 16 is free from the component metal atom from the substrate 12. In other words, in the DLC film 16, the composition ratio of the component metal atom from the substrate 12 (the metal contained in the intermediate layer 14) is 0.

The intermediate layer 14 and the DLC film 16 are successively formed by changing a condition for sputtering the component metal atom of the substrate 12 to a condition for not sputtering the atom as hereinafter described. Therefore, the DLC film 16 is highly compatible with the intermediate layer 14, and is firmly bonded thereto.

As is clear from the above, the intermediate layer 14 is firmly bonded to both of the substrate 12 and the DLC film 16, and the DLC film 16 is prevented from peeling off.

The thickness of the DLC film 16 may be appropriately selected depending on a desired property such as a sliding property. The thickness may be about 0.2 to 10 μm, though not particularly restrictive.

A method for producing the DLC film-formed material 10 will be described below.

Figure 2:
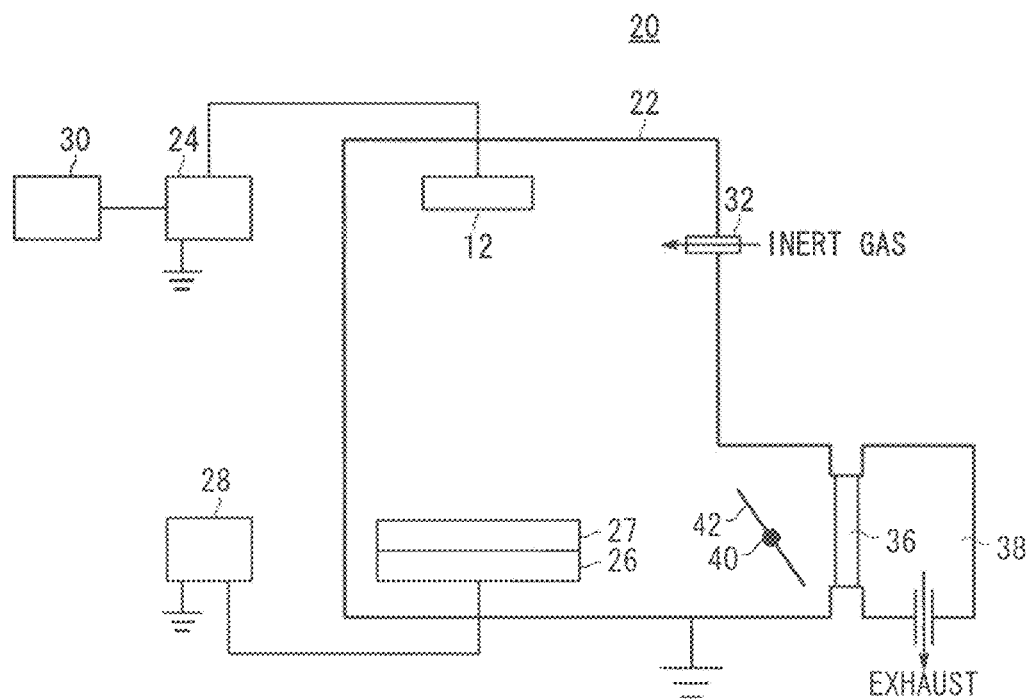
FIG. 2 is an overall schematic structural view showing a film formation apparatus for producing the DLC film-formed material of FIG. 1.

FIG. 2 is an overall schematic structural view showing the structure of a film formation apparatus 20 (a plasma film formation apparatus) for producing the DLC film-formed material 10. The film formation apparatus 20 contains a vacuum chamber 22 for containing the substrate 12, a negative bias supply 24 such as a high-frequency or dc power supply, and a carbon target 27 that can be electrified by a plasma generating electrode 26.

The plasma generating electrode 26 is placed in the bottom position of the vacuum chamber 22, while the substrate 12 is placed in the opposite position. A plasma generating power supply 28 is electrically connected to the plasma generating electrode 26, while the negative bias supply 24 is electrically connected to the substrate 12. The voltage generated by the negative bias supply 24 is controlled by a dynamic bias control mechanism 30 electrically connected thereto.

An inert gas inlet 32 is formed on the vacuum chamber 22. An inert gas is introduced from an inert gas source (not shown) through the inert gas inlet 32 into the vacuum chamber 22, and then used as a plasma source.

The vacuum chamber 22 is connected to an exhaust pump 38 by an exhaust passage 36. A baffle plate 42, supported axially rotatably by a holding shaft 40, is disposed upstream of the exhaust pump 38. When the baffle plate 42 extends in the horizontal direction of FIG. 2, the area shielding the exhaust passage 36 is minimized and the exhaust amount is maximized. On the other hand, when the baffle plate 42 extends in the vertical direction of FIG. 2, the shielding area is maximized and the exhaust amount is minimized.

The DLC film-formed material 10 may be produced using the film formation apparatus 20 having the above basic structure as follows.

First, the inert gas such as argon gas is introduced from the inert gas inlet 32 into the vacuum chamber 22, and the exhaust pump 38 is actuated. For example, the inner pressure of the vacuum chamber 22 is kept at 0.1 to 1 Pa.

Meanwhile, the plasma generating power supply 28 and the negative bias supply 24 are actuated, whereby an electric field is generated between the plasma generating electrode 26 and the substrate 12. A plasma is generated in the vacuum chamber 22 by the electric field. A negative bias of −100 to −1000 V, preferably −600 V, is applied to the substrate 12. The negative bias may be an alternate or direct current bias.

The substrate 12 is sputtered by the application of the negative bias. Thus, as shown in FIG. 3A, the component metal atoms contained in the substrate 12 (i.e. aluminum, magnesium, or silicon atoms, etc.) are released from the substrate 12 into the plasma. The carbon target 27 is simultaneously sputtered, so that the carbon atoms are released into the plasma.

Figure 4:
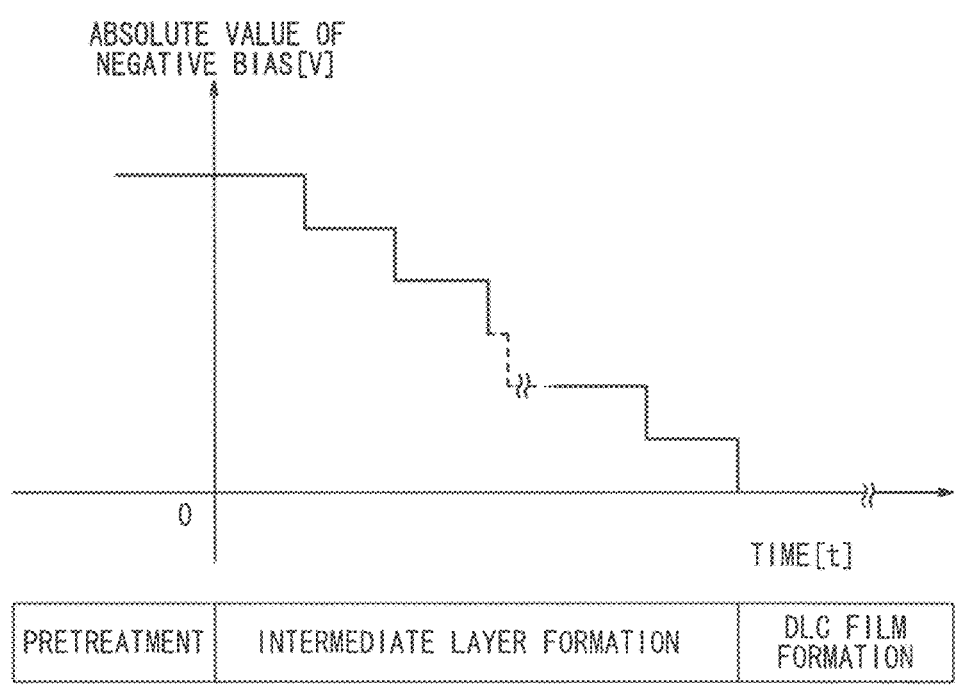
FIG. 4 is a graph showing an example of negative bias value change with time.

The negative bias applied to the substrate 12 is controlled by the dynamic bias control mechanism 30. Specifically, as shown in FIG. 4, the absolute value of the negative bias is reduced at a fixed time interval.

When the negative bias has an excessively large absolute value, the carbon atoms and the component metal atoms from the substrate 12 are dispersed in the plasma. When the absolute value is reduced, the carbon atoms and the component metal atoms from the substrate 12 are drawn toward the substrate 12. Then, as shown in FIG. 3B, the carbon atoms and the component metal atoms from the substrate 12 are deposited on the substrate 12 to start the formation of the intermediate layer 14.

When the negative bias has a larger absolute value, a larger amount of the component metal atoms are released from the substrate 12, and therefore a relatively smaller amount of the carbon atoms are used in the film formation. Thus, a portion of the intermediate layer 14, deposited in the initial stage of the film formation, has a higher metal composition ratio.

After predetermined time has elapsed, the absolute value of the negative bias applied to the substrate 12 is reduced stepwise at the fixed time interval by the dynamic bias control mechanism 30 as described above (see FIG. 4). Then, the amount of the component metal atoms and/or carbon atoms released from the substrate 12 is reduced, and therefore the ratio of the carbon atoms in the film is relatively increased. Thus, in the intermediate layer 14, a portion deposited after the reduction of the absolute value has a lower metal composition ratio and a higher carbon composition ratio, as compared with a portion deposited before the reduction.

By repeating the control of the negative bias, the intermediate layer 14 may be formed as the gradient layer having the decreasing metal composition ratio and the increasing carbon composition ratio with the thickness increase.

The absolute value of the negative bias is finally reduced to zero. In this stage, the metal atoms are not released from the substrate 12, and the carbon atoms are mainly used for the film formation. Thus, the formation of the intermediate layer 14 is completed, and the formation of the DLC film 16 is started as shown in FIGS. 3C and 4.

The formation of the DLC film 16 is completed when the formation is continued for a predetermined time under the negative bias of zero. Thus, the DLC film-formed material 10 shown in FIG. 1, which contains the intermediate layer 14 and the DLC film 16 stacked in this order on the surface of the substrate 12, is obtained.

As described above, the intermediate layer 14 contains the component metal atom from the substrate 12 and the DLC. Therefore, the bonding strengths between the intermediate layer 14 and the substrate 12 and between the intermediate layer 14 and the DLC film 16 are increased. The DLC film 16 is firmly bonded to the substrate 12 by the intermediate layer 14 containing the component metal atom from the substrate 12 and the DLC. It is conventionally difficult to prevent the peeling of the DLC film from the substance such as aluminum, magnesium, or silicon. In this embodiment, even in a case where the substrate 12 is composed of such substance, the peeling of the DLC film 16 can be efficiently prevented or avoided.

Furthermore, in the method of the embodiment, a further target and equipment are not required to form the intermediate layer 14. Thus, the structure of the film formation apparatus 20 can be kept to be simple without enlarging the apparatus 20, resulting in low equipment costs.

The DLC film-formed material 10 (i.e. the substrate 12 having the intermediate layer 14 and the DLC film 16) has a high abrasion resistance due to the high hardness of the DLC film 16, and has an excellent lubricity due to the low friction coefficient. Thus, the amount of a lubricant oil can be reduced to achieve resource saving and environmental load reduction.

Since the DLC film 16 is not readily peeled off, a sliding member using the DLC film-formed material 10 can exhibit an excellent lubricity over a long period, resulting in low running and maintenance costs.

In addition, the aluminum, magnesium, silicon, and alloys containing at least one of the elements used for the substrate 12 are lightweight metals, whereby the resultant DLC film-formed material 10 can achieve low weight with a low friction coefficient in this embodiment.

Though the sputtering method using the carbon target is exemplified in the above embodiment, the intermediate layer 14 and the DLC film 16 may be formed by a CVD method using a hydrocarbon gas instead. In this case, for example, the hydrocarbon gas may be a methane gas or an acetylene gas.

In this embodiment, the absolute value of the negative bias applied to the substrate 12 is reduced stepwise as shown in FIG. 4. The reduction is not limited thereto, and the absolute value may be reduced continuously (gradually) with time.

Though the aluminum, magnesium, silicon, and alloys containing at least one of the elements are described as preferred examples of the components for the substrate 12 in this embodiment, the component is not particularly limited thereto. For example, the substrate 12 may be composed of an iron-based alloy such as a steel.

EXAMPLE 1

The present invention will be described in detail below referring to Examples without intention of restricting the scope of the present invention.

A disk of A2017 (an aluminum alloy according to JIS) having a diameter of 24 mm and a thickness of 6 mm was prepared as a substrate 12. In the film formation apparatus 20 shown in FIG. 2, the substrate 12 and a graphite target (not shown) were placed in the vacuum chamber 22.

Then, the inner pressure of the vacuum chamber 22 was evacuated to less than $5 \times 10^{-4}$ Pa, and an Ar gas was introduced from the inert gas inlet 32 into the vacuum chamber 22. The Ar gas was supplied at a flow rate of 4 sccm to control the inner pressure of the vacuum chamber 22 at 1 Pa. The substrate 12 was left in this state for 2 hours while applying a negative bias of −600 V thereto, so that a surface of the substrate 12 was cleaned by an Ar ion etching.

A voltage was applied to the graphite target by supplying an electric power, to generate carbon atoms therefrom. The application start time was considered as the film formation start point.

The absolute value of the negative bias was repeatedly reduced by 100 V at an interval of 5 minutes by the dynamic bias control mechanism 30. Thus, the negative bias was changed to −500, −400, −300, −200, and −100 V stepwise. It was found that a film was formed on the substrate 12 under the negative bias of −500 to −100 V.

The negative bias was further changed from −100 to 0 V, and the film formation was continued for 5 minutes. A film was formed also under the negative bias of 0 V.

The films of thus obtained sample of Example were subjected to a componential analysis. As a result, the upper film was a DLC film 16, and the lower film was a metal-containing DLC layer. The metal composition ratio of the metal-containing DLC layer was increased in the direction toward the substrate 12.

For comparison, the same substrate 12 was subjected to the above pretreatment, and then the negative bias was rapidly changed to 0 V to form a DLC film 16, whereby a sample of Comparative Example was obtained.

The samples of Example and Comparative Example were subjected to a frictional wear test using a ball-on-disk method. In this test, a friction material of SUS304 (a stainless steel according to JIS) was used under a load of 100 gf, a linear speed of 0.785 cm/second, a rotation speed of 0.5 rotations/second, and a rotation radius of 5.0 mm.

Figure 5:
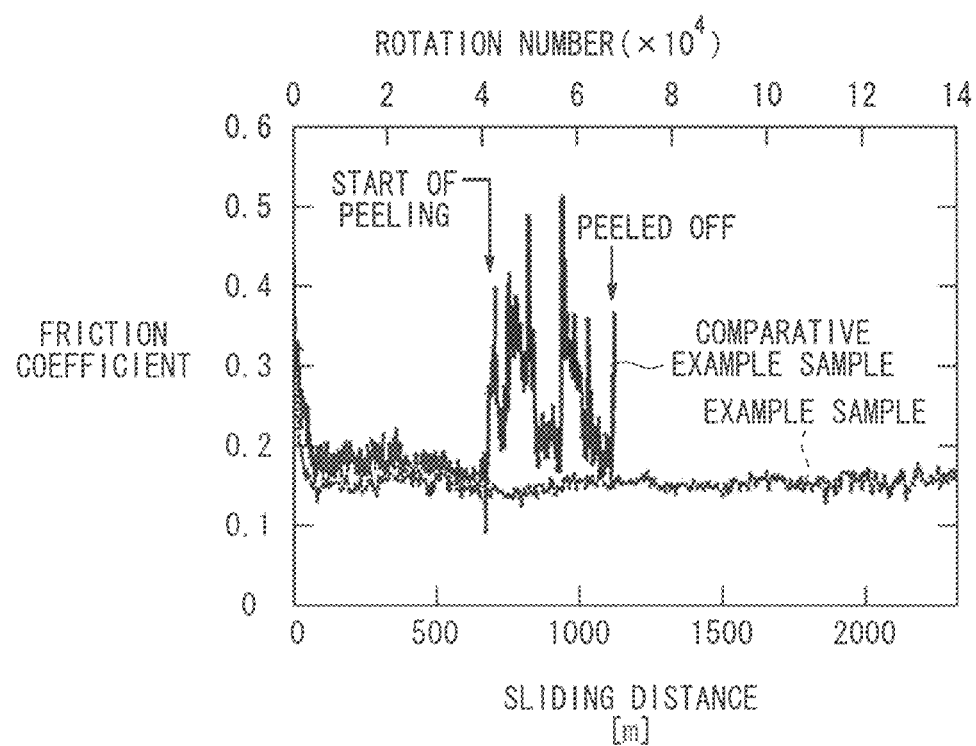
FIG. 5 is a graph showing the ball-on-disk frictional wear test results of samples of Example and Comparative Example.

The results are shown in FIG. 5. As shown in FIG. 5, in the sample of Comparative Example, the DLC film 16 peeled off at approximately 600 m corresponding to 40000 rotations. In contrast, in the sample of Example, the DLC film 16 did not peel and maintained the bonding even at approximately 2000 m corresponding to 120000 rotations.

Figure 6:
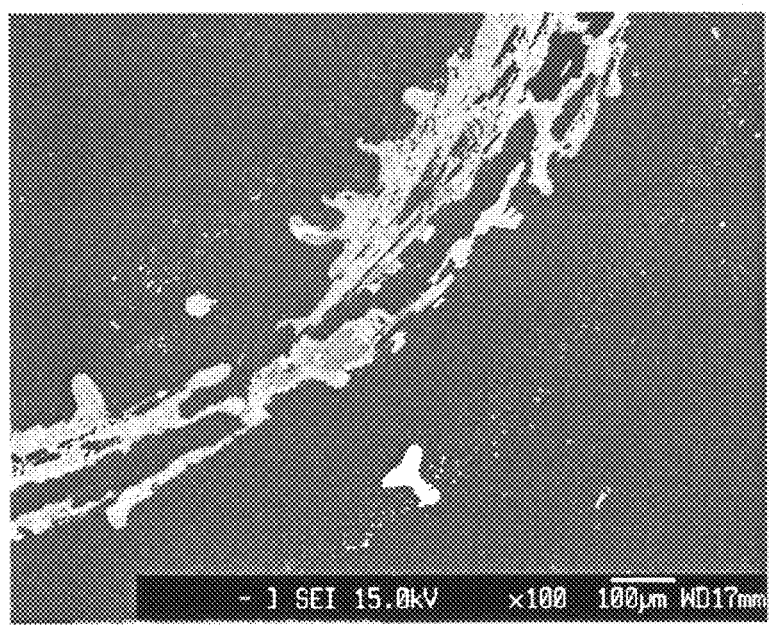
FIG. 6 is a scanning electron microscope (SEM) photograph at 100 magnifications of a wear track formed by a frictional wear test in the sample of Comparative Example.
Figure 7:
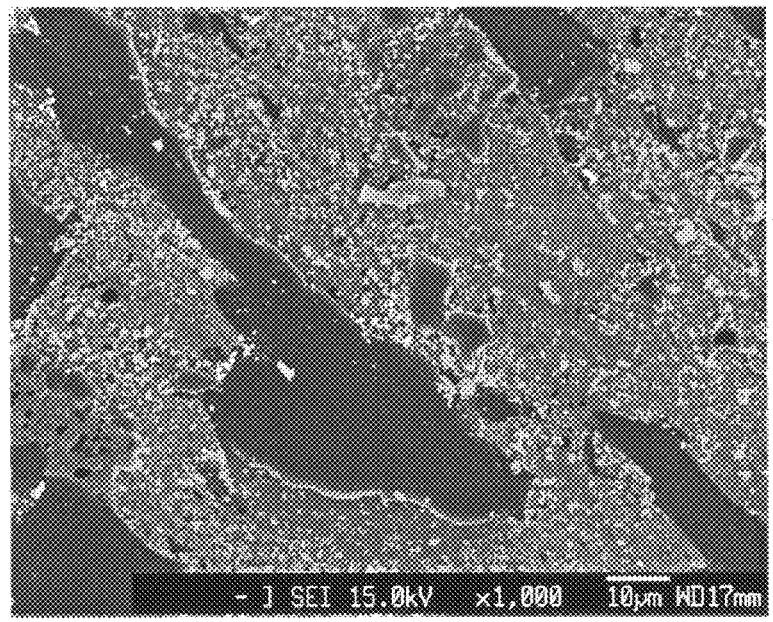
FIG. 7 is an SEM photograph at 1000 magnifications of the wear track in the sample of Comparative Example.
Figure 8:
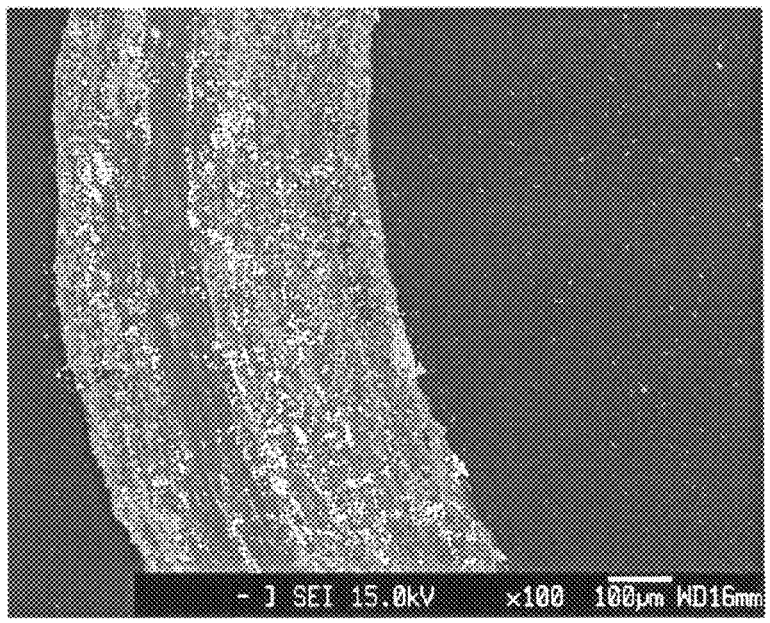
FIG. 8 is an SEM photograph at 100 magnifications of a wear track formed by the frictional wear test in the sample of Example.
Figure 9:
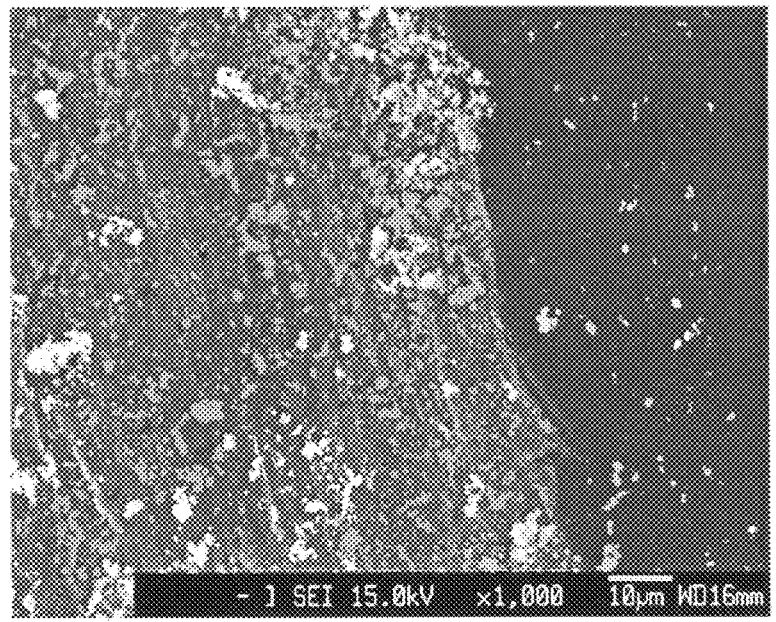
FIG. 9 is an SEM photograph at 1000 magnifications of the wear track in the sample of Example.

SEM photographs of a wear track formed by the frictional wear test in the sample of Comparative Example are shown in FIGS. 6 and 7, and SEM photographs of a wear track in the sample of Example are shown in FIGS. 8 and 9. The SEM photographs of FIGS. 6 and 8 were taken at 100 magnifications, and those of FIGS. 7 and 9 were taken at 1000 magnifications.

As shown in FIGS. 6 to 9, the DLC film 16 in the sample of Comparative Example peeled off, while the DLC film 16 in the sample of Example was only abraded and maintained the bonding to the substrate 12. As is clear from this, the peeling of the DLC film 16 can be prevented by forming the intermediate layer 14 containing the component metal atom from the substrate 12.

The diamond-like carbon film-formed material and the method for producing the same according to the present invention are not limited to the aforementioned embodiment. It should be understood that various changes and modifications may be made thereto without departing from the scope of the invention as set forth in the appended claims.

What is claimed is:

1. A diamond-like carbon film-formed material, comprising a substrate and a diamond-like carbon film with an intermediate layer therebetween,
   wherein:
   the intermediate layer is a composite layer comprising a component metal atom derived from the substrate and carbon, and is deposited on the surface of the substrate, with the diamond-like carbon film deposited on the surface of the intermediate layer;
   a composition ratio of the component metal atom in the intermediate layer decreases continuously in a direction from the substrate to the diamond-like carbon film, such that the composition ratio of the component metal atom in the intermediate layer does not increase in the direction from the substrate to the diamond-like carbon film; and
   the intermediate layer is a single layer.

2. The diamond-like carbon film-formed material according to claim 1, wherein the substrate comprises aluminum, magnesium, silicon, or an alloy comprising at least one of aluminum, magnesium, and silicon.

3. The diamond-like carbon film-formed material according to claim 2, wherein the intermediate layer consists of said component metal atom derived from the substrate and said carbon.

4. The diamond-like carbon film-formed material according to claim 1, wherein the intermediate layer has a thickness of 0.01 to 1.0 μm.

5. The diamond-like carbon film-formed material according to claim 4, wherein the intermediate layer consists of said component metal atom derived from the substrate and said carbon.

6. The diamond-like carbon film-formed material according to claim 1, wherein the diamond-like carbon film has a thickness of 0.2 to 10 μm.

7. The diamond-like carbon film-formed material according to claim 6, wherein the intermediate layer consists of said component metal atom derived from the substrate and said carbon.

8. The diamond-like carbon film-formed material according to claim 1, wherein the intermediate layer consists of said component metal atom derived from the substrate and said carbon.

9. A method for producing the diamond-like carbon film-formed material according to claim 8, the method comprising:
applying a negative bias to the substrate in a plasma to release a component metal atom from the substrate into the plasma;
generating a carbon atom from a carbon source while continuing the application of the negative bias to the substrate;
reducing an absolute value of voltage of the negative bias, thereby depositing the component metal atom from the substrate and the carbon atom on the surface of the substrate, in order to form the intermediate layer as a composite layer consisting of the component metal atom from the substrate and a diamond-like carbon; and
reducing the absolute value of the voltage of the negative bias to zero, thereby depositing only the carbon atom on the intermediate layer, to form the diamond-like carbon film,
wherein the absolute value of the voltage of the negative bias is reduced gradually from that of an initial bias applied for releasing the component metal atom from the substrate into the plasma, to zero for forming the diamond-like carbon film.

10. The method according to claim 9, wherein the absolute value of the voltage of the negative bias is reduced continuously from that of an initial bias applied for releasing the component metal atom from the substrate into the plasma, to zero for forming the diamond-like carbon film.

11. The diamond-like carbon film-formed material according to claim 1, wherein the substrate consists of a metal.

12. The diamond-like carbon film-formed material according to claim 11, wherein the metal is aluminum, magnesium, or silicon.

13. A method for producing the diamond-like carbon film-formed material according to claim 1, the method comprising:
applying a negative bias to the substrate in a plasma to release a component metal atom from the substrate into the plasma;
generating a carbon atom from a carbon source while continuing the application of the negative bias to the substrate;
reducing an absolute value of voltage of the negative bias, thereby depositing the component metal atom from the substrate and the carbon atom on the surface of the substrate, in order to form the intermediate layer as the composite layer comprising the component metal atom from the substrate and a diamond-like carbon; and
reducing the absolute value of the voltage of the negative bias to zero, thereby depositing only the carbon atom on the intermediate layer, to form the diamond-like carbon film,
wherein the absolute value of the voltage of the negative bias is reduced gradually from that of an initial bias applied for releasing the component metal atom from the substrate into the plasma, to zero for forming the diamond-like carbon film.

14. The method according to claim 13, wherein an initial bias of −100 to −1000 V is applied to release the component metal atom from the substrate into the plasma.

15. The method according to claim 13, wherein the absolute value of the voltage of the negative bias is reduced continuously from that of an initial bias applied for releasing the component metal atom from the substrate into the plasma, to zero for forming the diamond-like carbon film.

16. The method according to claim 13, wherein the substrate comprises aluminum, magnesium, silicon, or an alloy comprising at least one of aluminum, magnesium, and silicon.

17. The method according to claim 13, wherein a carbon target is used as the carbon source for generating the carbon atom that is contained in the intermediate layer and the diamond-like carbon film.

18. The method according to claim 13, wherein a hydrocarbon gas is used as the carbon source for generating the carbon atom that is contained in the intermediate layer and the diamond-like carbon film.

19. The method according to claim 13, wherein the intermediate layer has a thickness of 0.01 to 1.0 μm.

20. The method according to claim 13, wherein the diamond-like carbon film has a thickness of 0.2 to 10 μm.

* * * * *